United States Patent [19]

Chen et al.

[11] Patent Number: 5,800,930
[45] Date of Patent: Sep. 1, 1998

[54] NODULAR COPPER/NICKEL ALLOY TREATMENT FOR COPPER FOIL

[75] Inventors: Szuchain Chen; Nina Yukov, both of Orange, Conn.

[73] Assignee: Olin Corporation, New Haven, Conn.

[21] Appl. No.: 879,689

[22] Filed: Jun. 24, 1997

Related U.S. Application Data

[63] Continuation of Ser. No. 522,797, Sep. 5, 1995, abandoned, which is a continuation of Ser. No. 184,534, Jan. 21, 1994, abandoned.

[51] Int. Cl.$^6$ .................... B32B 15/20; C25D 5/18
[52] U.S. Cl. .................. 428/607; 205/104; 205/111; 428/612; 428/675; 428/687; 428/935
[58] Field of Search .................. 428/601, 607, 428/612, 671, 675, 687, 935; 205/50, 104, 111

[56] References Cited

U.S. PATENT DOCUMENTS

| | | | |
|---|---|---|---|
| Re. 30,180 | 12/1979 | Wolski et al. | 428/601 |
| 1,750,092 | 3/1930 | Crawford et al. | 205/256 |
| 1,969,553 | 8/1934 | Gernes | 205/240 |
| 3,247,082 | 4/1966 | Rose | 205/176 |
| 3,454,376 | 7/1969 | Luce et al. | 428/607 |
| 3,585,010 | 6/1971 | Luce et al. | 428/608 |
| 3,833,481 | 9/1974 | Olson et al. | 205/102 |
| 3,857,683 | 12/1974 | Castonguay | 428/608 |
| 4,131,517 | 12/1978 | Mitsuo et al. | 205/152 |
| 4,167,459 | 9/1979 | Lee et al. | 205/239 |
| 4,190,474 | 2/1980 | Berdan et al. | 156/151 |
| 4,199,417 | 4/1980 | Borruso | 205/239 |
| 4,387,006 | 6/1983 | Kajiwara et al. | 205/111 |
| 4,394,419 | 7/1983 | Konicek | 428/416 |
| 4,468,293 | 8/1984 | Polan et al. | 204/27 |
| 4,483,906 | 11/1984 | Nakatsugawa | 428/607 |
| 4,515,671 | 5/1985 | Polan et al. | 204/228 |
| 4,549,941 | 10/1985 | Parthasarathi et al. | 428/612 |
| 4,552,627 | 11/1985 | Parthasarathi | 204/27 |
| 4,568,431 | 2/1986 | Polan et al. | 205/77 |
| 4,619,871 | 10/1986 | Takami | 428/607 |
| 4,689,475 | 8/1987 | Kleiner et al. | 219/553 |
| 4,756,795 | 7/1988 | Bakos et al. | 216/18 |
| 4,789,438 | 12/1988 | Polan | 205/50 |
| 4,888,574 | 12/1989 | Rice et al. | 338/309 |
| 5,019,222 | 5/1991 | Hino et al. | 205/152 |
| 5,114,543 | 5/1992 | Kajiwara et al. | 205/152 |
| 5,230,932 | 7/1993 | Chen et al. | 428/607 |
| 5,234,573 | 8/1993 | Takami | 205/155 |
| 5,304,428 | 4/1994 | Takami | 428/607 |
| 5,320,919 | 6/1994 | Azuma et al. | 428/546 |

FOREIGN PATENT DOCUMENTS

| | | |
|---|---|---|
| 0 396 056 | 11/1990 | European Pat. Off. |
| 52-24133 | 2/1977 | Japan . |
| 52-145769 | 12/1977 | Japan . |
| 54-013971 | 1/1979 | Japan . |
| 2-084326 | 3/1990 | Japan . |
| 4-284690 | 10/1992 | Japan . |
| 5-029740 | 2/1993 | Japan . |
| 957808 | 5/1964 | United Kingdom . |
| 1 558 919 WPI | 1/1980 | United Kingdom . |
| 80-85631C | 11/1980 | WIPO . |
| WPI 94-23162 | 12/1993 | WIPO . |

OTHER PUBLICATIONS

Anonymous, Electroplated Copper Foil, *Research Disclosure*, No. 199, Nov. 1980, Article No. 19901, pp. 435–436.

Abner Brenner, *Electrodeposition of Alloys, Principles and Practice*, vol. I, Academic Press, New York, 1963, month of publication not available pp. 558–562.

*Primary Examiner*—Kathryn L. Gorgos
*Assistant Examiner*—William T. Leader
*Attorney, Agent, or Firm*—Wiggin & Dana; Gregory S. Rosenblatt

[57] ABSTRACT

There it is disclosed a chemical treatment for copper foil which imparts a dark brown to black color to the foil and improves the bond strength of the foil to a dielectric substrate without detrimentally changing the etching characteristics of the foil. The treatment includes depositing a nodular copper/nickel alloy layer on a surface of the foil. These nodules are 55% to 95% by weight copper and are electrolytically deposited using a pulse power controller.

3 Claims, 2 Drawing Sheets

NODULAR COPPER/NICKEL ALLOY TREATMENT FOR COPPER FOIL

CROSS REFERENCE TO RELATED APPLICATION

This patent application is a continuation of U.S. patent application Ser. No. 08/522,797 by Szuchain Chen et al. that was filed on Sep. 5, 1995 and is now abandoned, which in turn is a continuation of U.S. patent application Ser. No. 08/184,534 by Szuchain Chen et al. that was filed on Jan. 21, 1994 and is now abandoned.

BACKGROUND OF THE INVENTION

This invention relates to copper foil for printed circuit boards. More particularly, copper foil is electrolytically coated with a nodular copper/nickel alloy having in excess of 50% by weight copper.

Copper foils are widely used for the manufacture of printed circuit boards. One surface of the foil is laminated to a dielectric substrate, such as a glass filled epoxy board. The opposing surface is then coated with a photoresist and a circuit pattern etched into the foil by photolithographic techniques.

Copper foil is formed by either electrodeposition or is wrought. Electrodeposited foil is formed by immersing a stainless steel or titanium cathode roll in a copper ion containing electrolyte. When a voltage is impressed across the electrolyte, copper is deposited on the roll. The roll slowly turns and the copper foil is continuously removed and wound on a takeup roll. Wrought foil is formed by reducing the thickness of a cast copper bar to a desired thickness by multiple passes through rolling mills, usually with intermediate anneals.

The mechanical properties and etching characteristics of electrodeposited and wrought foils are different. A convention has been established to distinguish the foil type by the color a subsequent roughening treatment imparts to the foil. Electrodeposited foil is treated by a means which imparts a pink or copper color to the foil. One treatment is disclosed in U.S. Pat. No. 4,515,671 by Polan et al., which is incorporated by reference in its entirety herein. The patent discloses plating copper nodules on the surface of a copper foil by using pulsed current.

U.S. Pat. No. 4,131,517 by Mitsuo et al discloses a treatment which imparts a dark color on a foil. A copper/nickel alloy is electrolytically deposited on the foil. To increase the roughness of the dark coating, U.S. Pat. No. 5,114,543 by Kajiwara et al. discloses forming a rough surface by chemical immersion, such as by immersing a copper foil in an aqueous solution containing 100 grams per liter of ammonium persulfate. The roughened surface is then coated with a copper-nickel alloy layer.

U.S. Pat. No. 5,019,222 by Hino et al. discloses that copper/nickel alloys do not etch quickly or uniformly. The reduced etch rate of the coating requires an increased immersion time in an etch solution and increased undercutting of the copper foil is a problem. If the etch time is reduced, residual copper/nickel alloy may remain, reducing the resistivity of the dielectric substrate and, in severe cases, forming electrical shorts between adjacent copper foil circuit traces.

There exists, therefore, a need for a copper/nickel alloy treatment which improves the lamination strength of a wrought copper foil and does not have the inferior etching characteristics of the prior art treatments.

SUMMARY OF THE INVENTION

Accordingly, it is an object of the invention to provide a treatment for wrought copper foil which imparts a dark color to the foil and is rapidly removed by immersion in conventional chemical etch solutions. A second object of the invention is to provide a method for the deposition of this treatment. It is a feature of the invention that the dark treatment is a nodular copper/nickel alloy layer deposited on the surface of the copper foil. The alloy layer contains at least 50% by weight copper. Yet another feature of the invention is that the copper/nickel alloy treatment is electrolytic and deposited from an aqueous electrolyte containing copper ions and nickel ions using pulsed direct current.

An advantage of the invention is that the treatment deposits a dark coating on copper foil which both improves the strength of a lamination bond to a dielectric substrate and, if desired, distinguishes wrought foil from electrodeposited foil. Another advantage of the invention is that the dark treatment is readily removed in conventional chemical etching solutions. Yet another advantage is that the copper/nickel treatment of the invention has an etching rate in excess of twice as fast as prior art copper/nickel treatments.

In accordance with the invention, there is provided a composite foil. The foil contains a metallic substrate and a nodular coating layer adjacent at least one surface of the metallic substrate. The nodules are an alloy of copper and nickel containing at least 50% by weight copper.

In accordance with a second embodiment of the invention, there is provided a printed circuit board. The printed circuit board has a dielectric substrate with a copper or copper alloy foil bonded to at least one side. A nodular coating layer is disposed between the dielectric substrate and the foil. The copper/nickel alloy nodules contain at least 50% by weight copper.

In accordance with a third embodiment of the invention, there is provided a method for the deposition of a dark coating on a metallic substrate. The method includes the steps of:

(1) Immersing a metallic foil in an electrolytic cell having an anode and a volume of electrolyte. The electrolyte contains an aqueous solution of copper ions, and nickel ions.

(2) A first current density is then impressed through the electrolyte for a first time with the metallic foil as the cathode.

(3) A second current density is then impressed through the electrolyte for a second time with the metallic foil as the cathode. Both the first voltage and the second voltage are greater than zero.

(4) Steps (2) and (3) are sequentially repeated to deposit a dark coating having a thickness effective to increase the peel strength of the metallic foil when laminated to a dielectric substrate.

The above stated objects, features and advantages will become more apparent from the specification and drawings which follow.

IN THE DRAWINGS

3

Figure 4:
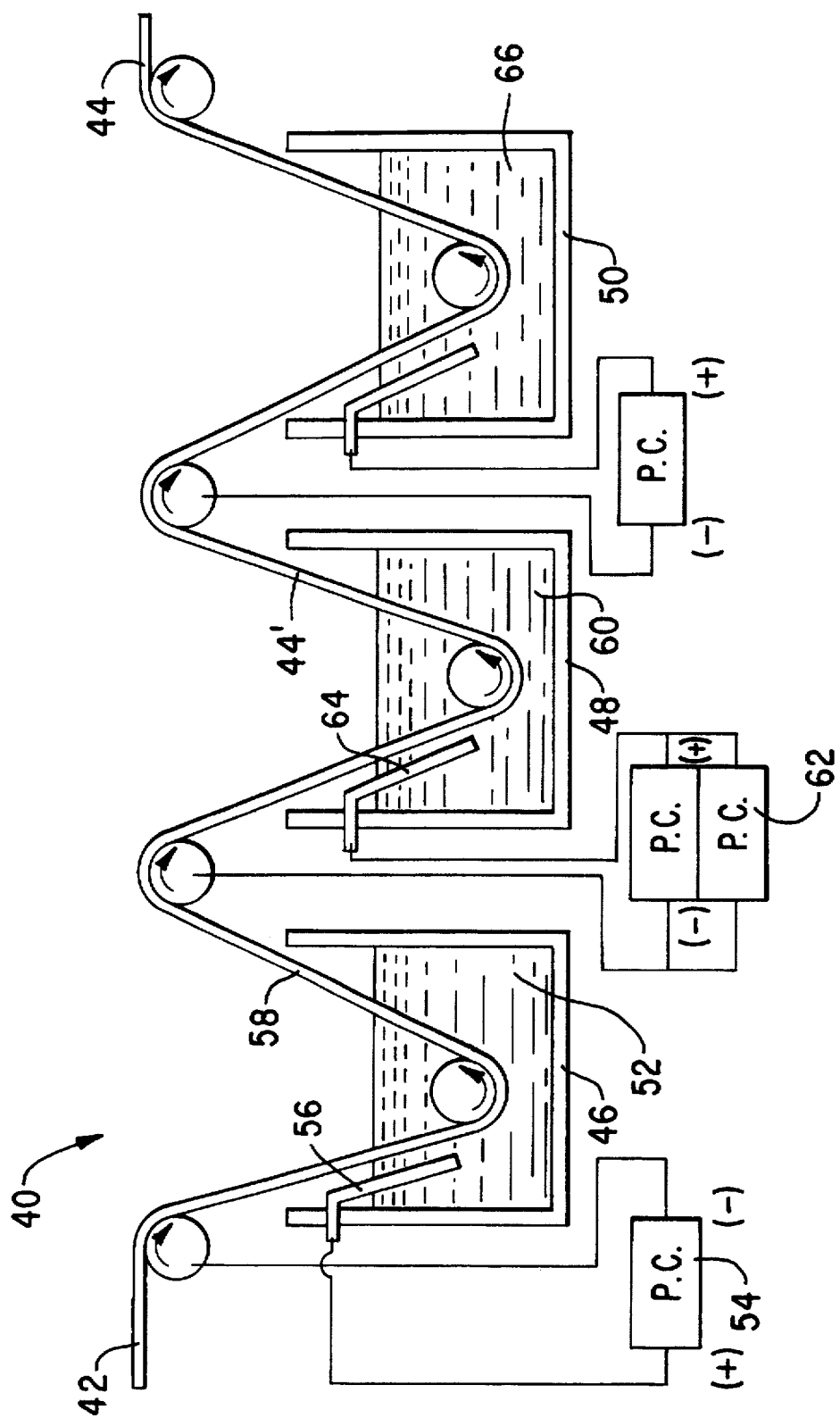

FIG. 4 schematically shows a plurality of electrolytic cells for treating metallic foil in accordance with the present invention.

DETAILED DESCRIPTION

Figure 1:
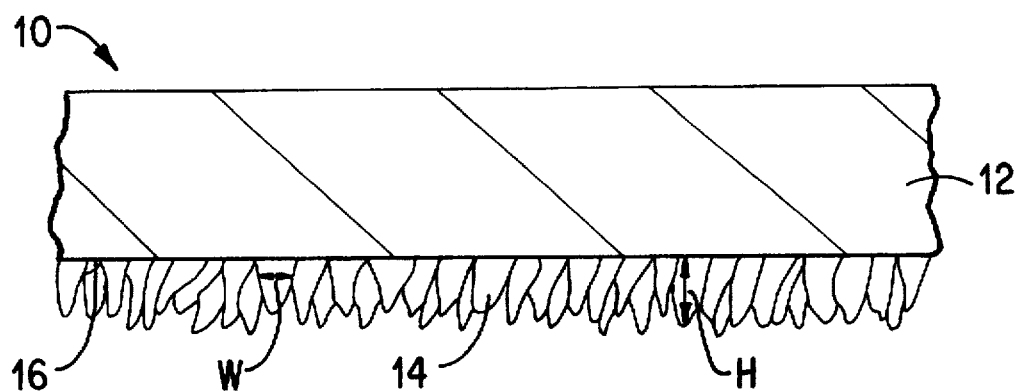
FIG. 1 shows in cross-sectional representation a metallic foil treated according to the process of the invention.

FIG. 1 shows in cross-sectional representation a composite foil 10 having a metallic substrate 12 and a nodular coating layer 14 adjacent at least one surface 16 of the metallic substrate 12. These nodules have an average cross sectional width, "W", of from about 0.05 micron to about 5 microns. More preferably, the average cross sectional width is from about 0.1 micron to about 1 micron. Most preferably, the cross-sectional width is from about 0.1 to about 0.5 micron. The average height, "H", of the nodules is from about 0.5 micron to about 3 microns. More preferably, the average height is on the order of from about 0.7 micron to about 1.5 microns. The thickness of the nodular layer is about equal to the average height, "H".

The nodules are formed from an alloy containing copper and nickel with a copper content of at least 50% by weight. Preferably, the weight percent of copper in the nodules is from about 55% to about 99% and more preferably, from about 70% to about 95%.

The metallic substrate 10 may be any suitable electrically conductive ductile material such as copper or a copper based alloy. The metallic substrate 12 may be formed by any suitable process such as electrodeposition or by a combination of rolling mill reductions and anneals as is characteristic of the manufacture of wrought foil. In accordance with the desire to deposit a dark treatment on wrought foils, the metallic substrate 12 is preferably a wrought copper or copper based alloy. The thickness of the metallic substrate is generally on the order of from about 0.013 mm to about 0.15 mm (0.0005–0.006 inch) and is typically on the order of from about 0.025 mm to about 0.100 mm (0.001–0.004 inch).

Figure 2:
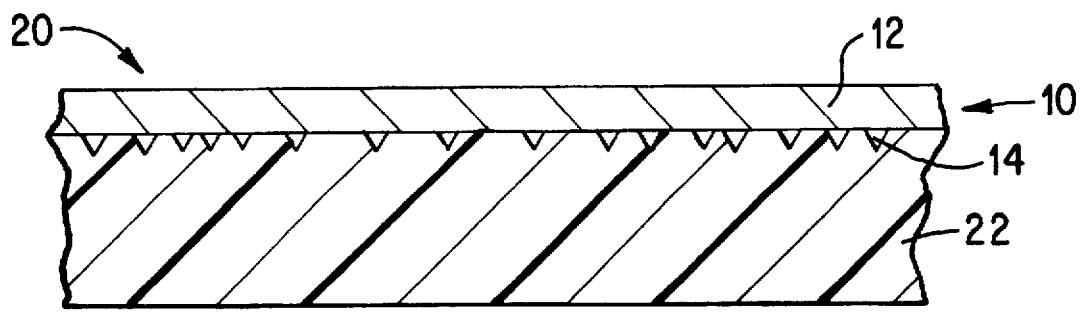
FIG. 2 shows in cross-sectional representation the foil of FIG. 1 following lamination to a dielectric substrate.

FIG. 2 shows in cross-sectional representation a printed circuit board 20 utilizing the composite foil 10 of the invention. The printed circuit board 20 has a dielectric substrate 22. Bonded to at least one side of the dielectric substrate 22 is a copper or copper based alloy foil 12. A nodular coating layer 14 is disposed between the dielectric substrate 22 and the copper or copper based alloy foil 12. The nodules are an alloy of copper and nickel containing at least 50% by weight copper. The preferred composition and size of the nodules is as described above.

Figure 3:
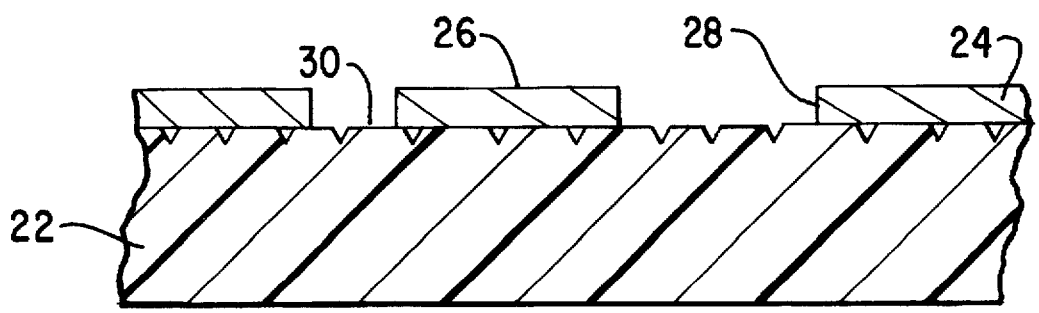
FIG. 3 shows in cross-sectional representation the laminated structure of FIG. 2 following photoimaging of the metallic foil.

The copper or copper alloy foil is bonded to the dielectric substrate 22 such as by lamination. Circuit traces 24, as illustrated in cross-sectional representation in FIG. 3, are then formed by photolithography as known in the art. Typically, the exterior surface 26 of the copper or copper based alloy foil is coated with a photo active polymer. A mask is interposed between the coated foil and a developing source such as an ultra-violet light. The mask permits the developing source to expose the photoresist in selected areas. A suitable solvent then removes the unexposed photoresist. The printed circuit board 20 is then immersed in a solution which etches the foil such as a mixture of hydrochloric acid and copper chloride. Advantageously, with the nodular copper/nickel alloy treatment of the invention, the coating layer 14 etches rapidly preventing undercutting of the edges 28 of the circuit traces 24. Metallic residue does not remain on the surface 30 of the dielectric substrate 22 which could reduce the resistivity of the substrate and cause an electrical short circuit.

One method of treating a metallic substrate in accordance with the invention is schematically illustrated in FIG. 4. A treatment line 40 converts an untreated metallic foil 42 to a treated foil 44 for lamination to a dielectric substrate. In preferred embodiments, the treatment line 40 includes at least three process tanks separated by rinse tanks or water sprays. The process tanks include a cleaning tank 46, a treatment tank 48 and a post treatment corrosion inhibitor 50. While only the treatment tank 48 is necessary for the deposition of a dark coating on a metallic substrate, in preferred embodiments all three tanks are utilized.

When the untreated foil 42 is copper or a copper based alloy, any suitable cleaning treatment may be added to cleaning tank 46. One suitable cleaning solution is an aqueous alkaline solution 52 containing 30 g/l sodium hydroxide. A first power controller 54 impresses a current density between the untreated strip 42 and a stainless steel anode 56 with the untreated foil 42 as the cathode. One suitable cleaning cycle is 10–40 mA/cm$^2$ for 10–40 seconds followed by either an anodic etch in an aqueous solution containing 20 g/l copper ions and 45 g/l sulfuric acid at a current density of 10–100 mA/cm$^2$ for a time of 5–40 seconds or by an alternating current etch at from about 10–100 mA/cm$^2$ for 5–40 seconds in an electrolyte containing from about 15–25 g/l copper as copper ions and from about 40–50 g/l sulfuric acid at a temperature of from about 25° C. to about 55° C.

An alternative one step cleaning process utilizes a cleaning solution containing sodium hydroxide, an alkaline metal carbonate, an alkaline metal silicate and surfactant as the electrolyte 52 in an anodic etch of the copper foil 42. The foil 52 is made the anode and the electrode 56 becomes the cathode. The current density is in the range of from about 10–100 mA/cm$^2$ for from about 10–40 seconds at a temperature of from about 40° C. to 60° C.

The cleaned foil 58 exits the cleaning tank 46 and is either subsequently etched, as described above, and then rinsed or simply rinsed in deionized water. The strip is then immersed in treatment tank 48. The treatment tank 48 contains an electrolytic cell having an anode 64, a volume of electrolyte 60 and the cleaned foil 58 as the cathode. One suitable electrolyte 60 for treatment tank 48 is:

| Copper as copper metal ions | 3–20 g/l |
| Nickel as nickel metal ions | 3–20 g/l |
| Sodium citrate dihydrate | 40–210 g/l |
| pH | 4–9 |
| temperature | 30° C.–60° C. |
| The preferred ranges for this electrolyte are: | |
| Copper as copper metal ions | 9–15 g/l |
| Nickel as nickel metal ions | 9–15 g/l |
| Sodium citrate dihydrate | 95–155 g/l |
| pH | 5–7 |
| temperature | 40° C.–50° C. |

The electrolyte 60 may be made up from any suitable source of copper ions and nickel ions such as copper sulfate and nickel sulfate. Any suitable ion source may also be used for chemical replenishment. In one preferred embodiment, the carbonates and hydroxides of copper and nickel are employed as well as citric acid and sodium hydroxide.

A pulse power controller 62 capable of impressing two separate current densities, both greater than zero, across the cleaned copper foil 58 is employed with the cleaned copper foil 58 as the cathode and a stainless steel anode 64 in spaced relationship to the foil. The pulse power controller 62 applies a first current density, "the peak pulse", of from about 100 to about 400 mA/cm$^2$ across the treatment tank 48. This is followed by a second current density, "the base pulse", of from about 10 to about 100 mA/cm². The duration of the peak pulse is about 10 to about 50 milliseconds and of the base current pulse from about 5 to about 20 milliseconds.

A more preferred duty cycle utilizes a peak pulse of from about 100 mA/cm² to about 250 mA/cm² and a base pulse of from about 25 to about 75 mA/cm². The peak pulse is from about 15 to about 25 milliseconds and the base pulse is from about 10 to about 20 milliseconds.

The sequence of peak pulse followed by base pulse is repeated for an overall plating time of from about 5 to about 40 seconds and preferably from about 10 to about 20 seconds. The overall time is that sufficient to deposit a nodular layer of a thickness effective to increase peel strength following lamination, generally on the order of about 0.5–3 microns. The treated foil 44' has a dark brown to black color.

To improve the tarnish resistance of the treated copper foil 44', the treated foil is preferably immersed in a post treatment corrosion inhibitor 66. Suitable corrosion inhibitors include aqueous chromate and phosphate solutions as known in the art.

Another corrosion inhibitor is a chromium-zinc anti-tarnish layer having a zinc to chromium ratio in excess of about 4:1 by weight. Preferably, the zinc to chromium ratio is from about 6:1 to about 10:1 as more fully disclosed in U.S. Pat. No. 5,230,932 to Chen et al. which is incorporated by reference herein in its entirety. This anti-tarnish corrosion inhibitor provides the treated foil 44 with a slightly darker color as well as improved tarnish resistance.

The following examples illustrate the benefits of the treatment of the invention. The examples are illustrative and do not limit the scope of the invention.

EXAMPLE 1

A 1 ounce per square foot wrought copper foil (thickness= 35 microns (0.0014 inch)) was cathodically cleaned in an alkaline solution of 30 g/l sodium hydroxide at 11 mA/cm² for 40 seconds followed by an alternating current etch at 56 mA/cm² for 10 seconds in an aqueous solution containing 20 g/l copper as metallic copper ions and 45 g/l sulfuric acid. The temperature of the electrolyte was 50° C.

After a deionized water rinse, the foil was plated with copper/nickel nodules for 10 seconds using repeated peak pulses of 143 mA/cm² and base pulses of 48 mA/m² with a duty cycle of 23 milliseconds for the peak current and 13 milliseconds for the base current. The plating solution contained 15 g/l copper ions as metallic copper, 9 g/l nickel ions as nickel sulfate, and 131 g/l sodium citrate dihydrate with a pH of 5 and an electrolyte temperature of 40° C.

The treated foil was then coated with a layer of chromium/zinc anti-tarnish coating and laminated to a thick dielectric substrate using an acrylic adhesive. The treated foil had a dark brown to black color. The force required to peel the laminated foil from the dielectric substrate was then measured. With the foil treated in accordance with the invention, a peel strength of 11.7 pounds per inch was obtained. Industry standards usually require a pull strength in excess of 8 pounds per inch. An untreated foil had a peel strength of 4 pounds per inch.

EXAMPLE 2

A copper foil was treated according to the process of Example 1. A control sample was coated with a conventional copper/nickel alloy coating in accordance with the teachings of U.S. Pat. No. 4,131,517. Both samples were then immersed in typical etching solutions for 10 seconds. The amount of treatment removed was determined by calculating the weight loss of the sample and extrapolating to determine the number of mils (0.001 inch) removed per minute. As shown in the Table, in each etch solution, the treatment of the invention had a higher weight loss indicative of a more rapid etch rate.

| Etch Rate - Inches × 1000/Minute | | |
| --- | --- | --- |
| Etching Solution | Inventive Treatment | 4,131,517 Treatment |
| Ferric Chloride | 0.150 | 0.126 |
| Alkaline Ammonia | 0.252 | 0.066 |
| Cupric Chloride | 0.024 | 0.0006 |

While the invention has been described in terms of treatments for copper foil for use in printed circuit boards, it is equally applicable to treatments for other metallic foils in which mechanical adhesion is to be improved without a decrease in the etching characteristic of the substrate. It is equally applicable to other metallic substrates other than copper or copper based alloys such as nickel and nickel based alloys.

It is apparent if there has been provided in accordance with this invention an electrochemical treatment for copper foil that improves the bond strength and which fully satisfies the objects, means and advantages set forth herein before. While the invention has been described in combination with specific embodiments thereof, it is evident that many alternatives, modifications and variations will be apparent to those skilled in the art in light of the foregoing description. Accordingly, it is intended to enhance all such alternatives, modifications and variations as fall within the spirit and broad scope of the appended claims.

What is claimed is:

1. A composite foil, comprising:

a wrought copper or copper based alloy substrate; and a nodular coating layer having a dark brown to black color adjacent to at least one surface of said copper or copper based alloy substrate, said nodular coating layer being an alloy of copper and nickel containing, by weight, from 55% to 95% of copper and the balance nickel, and nodules forming said nodular coating layer having an average cross-sectional width of from about 0.05 micron to about 5 microns and an average height of from about 0.5 micron to about 3 microns whereby said nodular coating layer has an etch rate in excess of that of a non-nodular copper/nickel alloy coating having substantially the same ratio of copper to nickel in the deposited coating layer when etched in an alkaline ammonia solution.

2. The composite foil of claim 1 wherein said nodular coating layer contains from 70% to 95% by weight of copper and the balance nickel.

3. The composite foil of claim 2 wherein said nodules have an average cross-sectional width of from about 0.1 micron to about 1 micron and an average height of from about 0.7 micron to about 1.5 microns.

\* \* \* \* \*